United States Patent
Dutta et al.

(10) Patent No.: US 11,621,294 B2
(45) Date of Patent: Apr. 4, 2023

(54) EMBEDDING MRAM DEVICE IN ADVANCED INTERCONNECTS

(71) Applicant: International Business Machines Corporation, Armonk, NY (US)

(72) Inventors: Ashim Dutta, Menands, NY (US); Saumya Sharma, Easton, CT (US); Tianji Zhou, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 16/886,830

(22) Filed: May 29, 2020

(65) Prior Publication Data
US 2021/0375986 A1    Dec. 2, 2021

(51) Int. Cl.
| H01L 27/22 | (2006.01) |
| H01L 43/02 | (2006.01) |
| H01L 43/12 | (2006.01) |

(52) U.S. Cl.
CPC ............ *H01L 27/222* (2013.01); *H01L 43/02* (2013.01); *H01L 43/12* (2013.01)

(58) Field of Classification Search
CPC ........ H01L 27/222; H01L 43/02; H01L 43/12
See application file for complete search history.

(56) References Cited

U.S. PATENT DOCUMENTS

| | | | |
|---|---|---|---|
| 9,343,659 B1 | 5/2016 | Lu et al. | |
| 9,997,562 B1 | 6/2018 | Wang et al. | |
| 2003/0047728 A1* | 3/2003 | Chen | B82Y 10/00 257/E27.005 |
| 2009/0124061 A1 | 5/2009 | Kiyotoshi | |
| 2009/0127648 A1 | 5/2009 | Chen et al. | |
| 2013/0119494 A1 | 5/2013 | Li et al. | |
| 2013/0267042 A1* | 10/2013 | Satoh | H01L 27/222 438/3 |
| 2016/0365505 A1 | 12/2016 | Lu et al. | |
| 2017/0301856 A1 | 10/2017 | Chuang et al. | |
| 2019/0157544 A1 | 5/2019 | Hsu et al. | |
| 2019/0273118 A1 | 9/2019 | Chuang et al. | |

FOREIGN PATENT DOCUMENTS

| CN | 103377980 A | 10/2013 |
| WO | 2019066830 A1 | 4/2019 |

* cited by examiner

*Primary Examiner* — Errol V Fernandes
(74) *Attorney, Agent, or Firm* — Cantor Colburn LLP; L. Jeffrey Kelly

(57) ABSTRACT

A technique relates to an integrated circuit (IC). Pillars of a set of memory elements are formed. A bilayer dielectric is formed between the pillars, the bilayer dielectric having an upper dielectric material formed on a lower dielectric material without requiring an etch of the lower dielectric material prior to forming the upper dielectric material, thereby preventing a void in the bilayer dielectric, the lower dielectric material including one or more flowable dielectric materials.

17 Claims, 14 Drawing Sheets

FORM MAGNETORESISTIVE RANDOM ACCESS MEMORY (MRAM) PILLARS  1302

FORM A BILAYER DIELECTRIC BETWEEN THE MRAM PILLARS, THE BILAYER DIELECTRIC COMPRISING AN UPPER DIELECTRIC MATERIAL FORMED ON A LOWER DIELECTRIC MATERIAL WITHOUT REQUIRING AN ETCH OF THE LOWER DIELECTRIC MATERIAL PRIOR TO FORMING THE UPPER DIELECTRIC MATERIAL, THEREBY PREVENTING A VOID IN THE BILAYER DIELECTRIC, THE LOWER DIELECTRIC MATERIAL COMPRISING ONE OR MORE FLOWABLE DIELECTRIC MATERIALS  1304

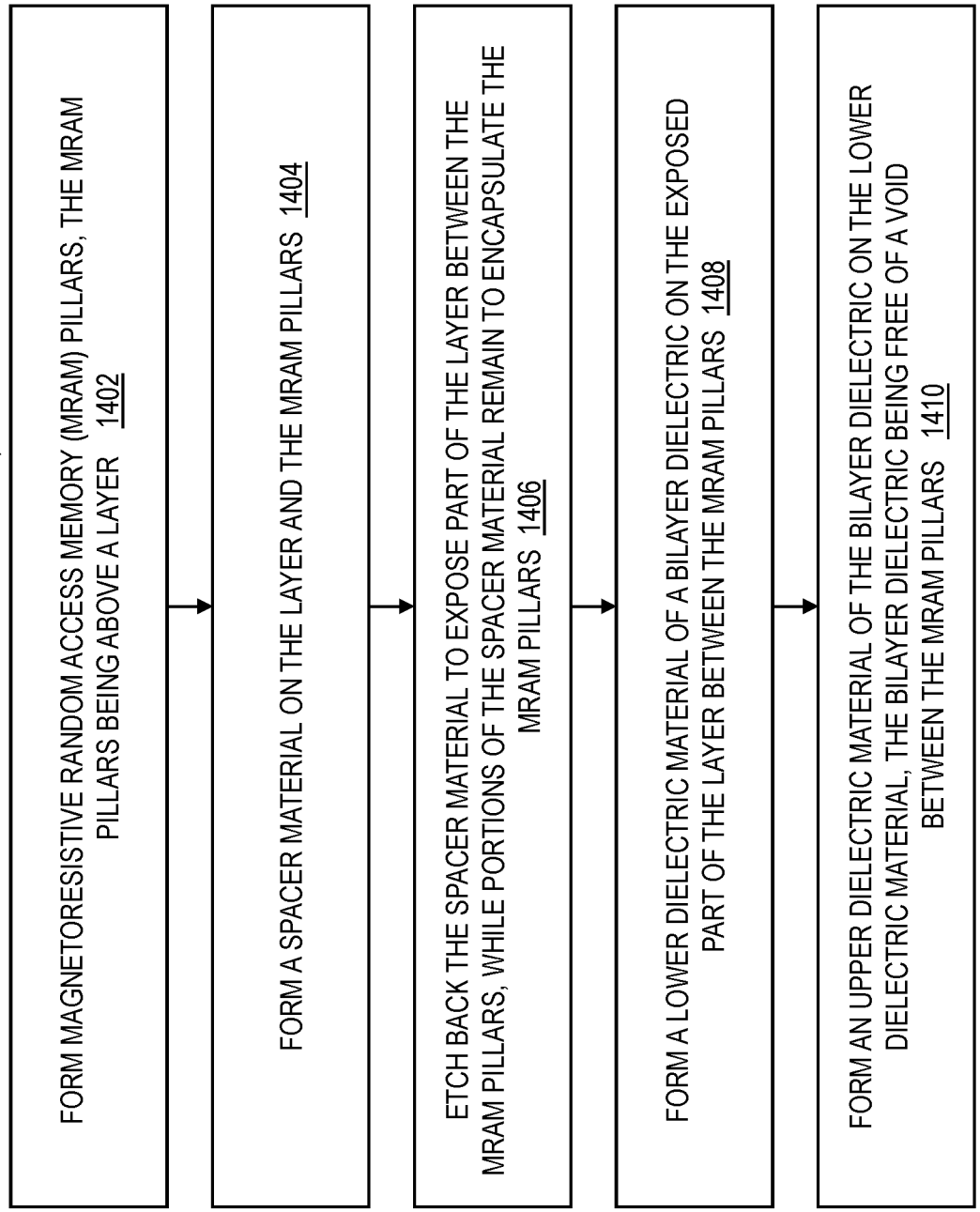

EMBEDDING MRAM DEVICE IN ADVANCED INTERCONNECTS

BACKGROUND

The present invention generally relates to fabrication methods and resulting structures for integrated circuits (ICs), and more specifically, to fabrication methods and resulting structures for embedding magnetoresistive random access memory (MRAM) in advanced back-end-of-line (BEOL) interconnect structures.

ICs (also referred to as a chip or a microchip) include electronic circuits on a wafer. The wafer is a semiconductor material, such as, for example, silicon or other materials. An IC includes a large number electronic devices that form the electronic circuits on the wafer. The BEOL is the second portion of IC fabrication where a network of vias and lines (known collectively as interconnect structures) of the IC is formed. The IC's individual devices, such as transistors, capacitors, resistors, etc. are formed in earlier layers of the IC and communicatively coupled with one another using the interconnect structures in the BEOL layers of the wafer. The BEOL layers that include the interconnection of wiring are referred to as the metallization layers, which generally begins when the first layer of metal is deposited on the wafer. BEOL layers of the IC generally include contacts, insulating layers (dielectrics), metal levels, bonding sites for chip-to-package connections, etc.

SUMMARY

A non-limiting example of a method for forming a portion of an integrated circuit (IC) includes forming pillars of a set of memory elements, and forming a bilayer dielectric between the pillars. The bilayer dielectric includes an upper dielectric material formed on a lower dielectric material without requiring an etch of the lower dielectric material prior to forming the upper dielectric material, thereby preventing a void in the bilayer dielectric, the lower dielectric material including one or more flowable dielectric materials.

A non-limiting example of a method for forming a portion of an IC includes forming pillars of a set of memory elements, the pillars being above a layer, and forming a spacer material on the layer and the pillars. The method includes etching back the spacer material to expose part of the layer between the pillars while portions of the spacer material remain to encapsulate the pillars, and forming a lower dielectric material of a bilayer dielectric on the part of the layer exposed between the pillars. Also, the method includes forming an upper dielectric material of the bilayer dielectric on the lower dielectric material, the bilayer dielectric being free of a void between the pillars.

A non-limiting example of an IC includes pillars of a set of memory elements, the pillars having sides encapsulated by spacer material. The IC includes a bilayer dielectric formed between the pillars and on the spacer material, the bilayer dielectric including an upper dielectric material formed on a lower dielectric material, the upper and lower dielectric materials both including a curved bottom configured to prevent a void in the bilayer dielectric between the pillars, the curved bottom being located between the pillars.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 2-12 depict cross-sectional views of a portion of an IC wafer after fabrication operations for forming the IC wafer shown in FIG. 1 according to one or more embodiments of the invention, in which:

FIG. 2 depicts a cross-sectional view of a portion of the IC wafer after fabrication operations to form interconnects according to one or more embodiments of the invention;

FIG. 3 depicts a cross-sectional view of the portion of the IC wafer after fabrication operations for dielectric cap formation according to one or more embodiments of the invention;

FIG. 4 depicts a cross-sectional view of the portion of the IC wafer after fabrication operations for bottom electrode contact formation according to one or more embodiments of the invention;

FIG. 5 depicts a cross-sectional view of the portion of the IC wafer after fabrication operations forming layers of a magnetic tunnel junction according to one or more embodiments of the invention;

FIG. 6 depicts a cross-sectional view of the portion of the IC wafer after fabrication operations depositing a lithography stack according to one or more embodiments of the invention;

FIG. 7 depicts a cross-sectional view of the portion of the IC wafer after fabrication operations for patterning the magnetic tunnel junction according to one or more embodiments of the invention;

FIG. 8 depicts a cross-sectional view of the portion of the IC wafer after fabrication operations for encapsulation deposition according to one or more embodiments of the invention;

FIG. 9 depicts a cross-sectional view of the portion of the IC wafer after fabrication operations for encapsulation etch back according to one or more embodiments of the invention;

FIG. 10 depicts a cross-sectional view of the portion of the IC wafer after fabrication operations for a bottom-up dielectric fill with a first dielectric material according to one or more embodiments of the invention;

FIG. 11 depicts a cross-sectional view of the portion of the IC wafer after fabrication operations for another dielectric fill with a second dielectric material according to one or more embodiments of the invention;

FIG. 12 depicts a cross-sectional view of the portion of the IC wafer after fabrication operations for top electrode contact formation according to one or more embodiments of the invention;

FIG. 13 is a flow chart of a method for forming a portion of an IC wafer according to one or more embodiments of the invention; and FIG. 14 is a flow chart of a method for forming a portion of an IC wafer according to one or more embodiments of the invention.

Figure 1:
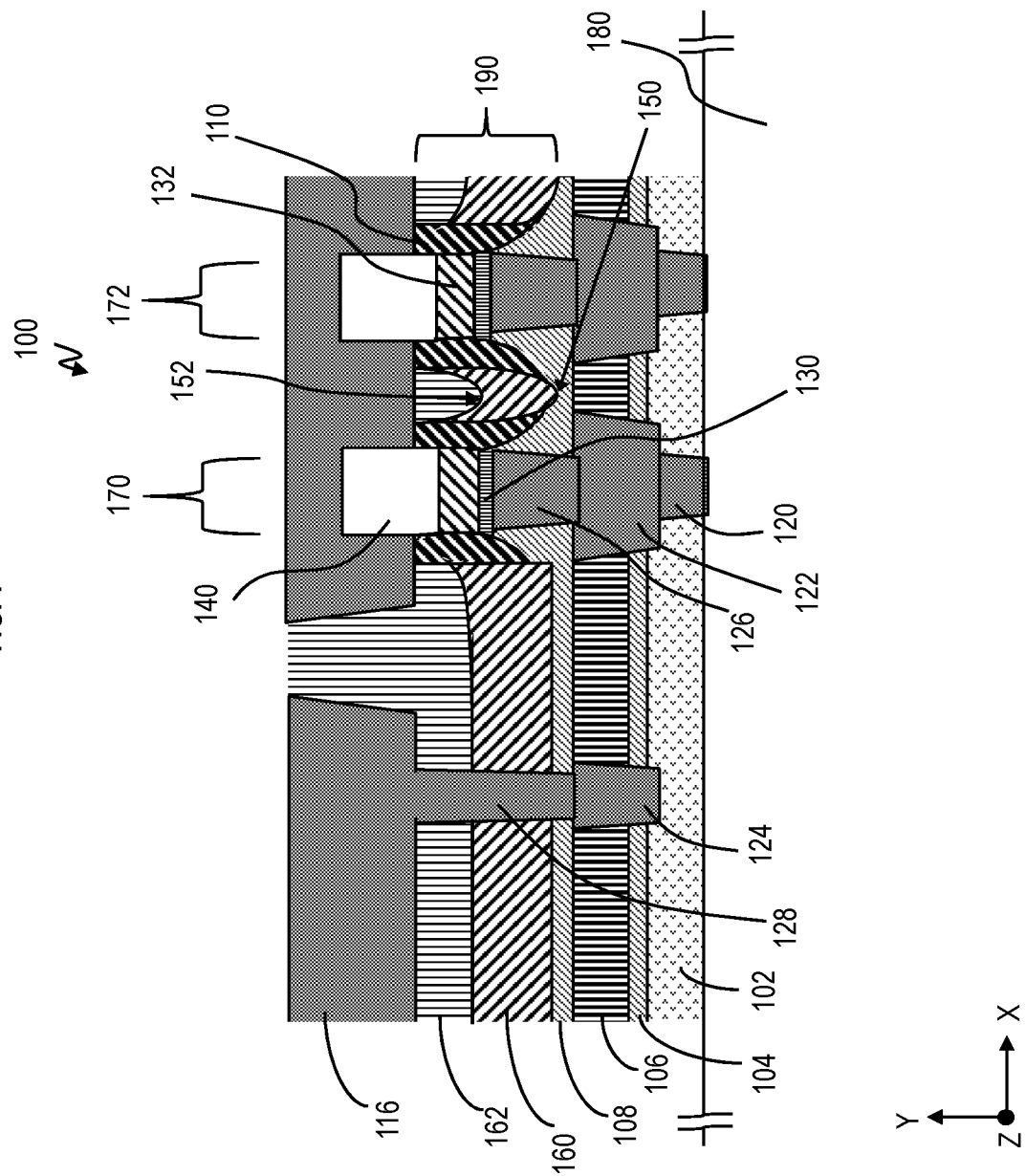
FIG. 1 depicts a cross-sectional view of a portion of an IC wafer fabricated according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, ICs are typically formed from a large number of semiconductor devices and conductive interconnect layers. More specifically, during the first portion of chip-making (i.e., the front-end-of-line (FEOL) stage), the individual components (transistors, capacitors, etc.) are fabricated on the wafer. The middle-of-line (MOL) stage follows the FEOL stage and typically includes process flows for forming the contacts and other structures that communicatively couple to active regions (e.g., gate, source, and drain) of the device element. In the BEOL stage, these device elements are connected to each other through a network of interconnect structures to distribute signals, as well as power and ground. The conductive interconnect layers formed during the BEOL stage serve as a network of pathways that transport signals throughout an IC, thereby connecting circuit components of the IC into a functioning whole and to the outside world. Because there typically is not enough room on the chip surface to create all of the necessary connections in a single layer, chip manufacturers build vertical levels of interconnects. While simpler ICs can have just a few metallization layers, complex ICs can have ten or more layers of wiring.

BEOL-stage interconnect structures that are physically close to FEOL-stage components (e.g., transistors and the like) need to be small because they attach/join to the components that are themselves very small and often closely packed together. These lower-level lines, which can be referred to as local interconnects, are usually thin and short in length. Global interconnects are higher up in the IC layer structure and travel between different blocks of the circuit. Thus, global interconnects are typically thick, long, and more widely separated local interconnects. Vertical connections between interconnect levels (or layers), called metal-filled vias, allow signals and power to be transmitted from one layer to the next. These vertical interconnect structures include an appropriate metal and provide the electrical connection of the various stacked metallization layers. A magnetoresistive random access memory (MRAM) device can be formed in the BEOL and connected to various FEOL-stage components (e.g., transistors and the like) using vertical interconnects. Dielectric material separates MRAM pillars of MRAM devices. In the embedded MRAM pillar formation process for MRAM devices, it can difficult to avoid seam or void formation in between pillars, and this seam/void reduces breakdown strength of the dielectric materials and degrades device reliability. This problem becomes more challenging for a tighter pitch MRAM pillar array, for example, with 14 nanometer (nm) lithography process technology and greater.

Turning now to an overview of aspects of the invention, one or more embodiments of the invention provide a method and structure for forming embedded magnetoresistive random access memory (MRAM) devices where a bilayer dielectric with two different fill processes is used to improve the quality of dielectric fill between and/or surrounding MRAM pillars. Voids and/or seams are empty spaces in the bilayer dielectric, and using two different fill processes to form the bilayer dielectric avoid/prevents these empty spaces. For example, the first or lower dielectric layer of bilayer dielectric can be selected to be a flowable dielectric material having a good gap fill property and/or a dielectric material that can be deposited on dielectric material selective to metal using atomic layer deposition. The second or upper dielectric layer of bilayer dielectric can be any dielectric with good breakdown voltage strength. The first or lower dielectric layer reduces the aspect ratio of the trench between MRAM pillars for the second/upper dielectric layer, which eliminates voids or seams.

Turning now to a more detailed description of aspects of the present invention, FIG. 1 depicts a cross-sectional view of a portion of an IC wafer 100 after fabrication operations according to one or more embodiments of the invention. The wafer 100 can be part of the back-end-of-line (BEOL) and/or the juncture of the middle-of-line (MOL) and BEOL. There can be many other devices already fabricated in the substrate 180. FIG. 1 shows interconnects 120 in layer 102, which are connected to interconnects 122 formed in layers 104 and 106. Interconnects 122 are respectively connected to interconnects 126 formed in layer 108. Interconnects 126 respectively couple to MRAM devices including bottom electrode 130, magnetic tunnel junction (MTJ) 132, and top electrode 140. Bottom electrode 130, MTJ 132, and top electrode 140 are used to form MRAM pillars 170 and 172. MRAM pillars 170 and 172 are separated by bilayer dielectric 190 which includes first or lower dielectric material 160 and second or upper dielectric material 162. The top electrode 140 is connected to metal layer 116. Spacer material 110 can be formed on sides of MTJ 132. Also, interconnect 124 is formed in layers 104 and 106 and is connected to interconnect 128. Interconnect 128 is connected to connected to metal layer 116.

As noted above, the bilayer dielectric 190 includes first or lower dielectric material 160. The first or lower dielectric material 160 can be a flowable dielectric material. Example flowable dielectric materials include flowable spin-on-dielectric (SOD) dielectrics, flowable chemical vapor deposition (FCVD) dielectrics, etc., along with combinations thereof. Additionally, first or lower dielectric material 160 can have one layer of a single film or multiple layers of different flowable films. The second or upper dielectric material 162 of bilayer dielectric 190 has a greater dielectric breakdown strength and/or breakdown voltage than first or lower dielectric material 160. The breakdown voltage of an insulator is the minimum voltage that causes a portion of an insulator to become electrically conductive. For example, electrical breakdown or dielectric breakdown is when current flows through an electrical insulator because the voltage applied across it exceeds the breakdown voltage. Example materials of second or upper dielectric material 162 include SiN, SiOx, SiCN, and SiCN(H) (where SiCN(H) denotes SiCN doped with H), as well as ultra-low-k dielectric materials. The dielectric constant (k) of ultra-low-k dielectric materials can be equal to or less than about 2.5 in one or more embodiments of the invention.

Example materials of interconnects 120, 122, 124, 126, and 128 along with metal layer 116 can include Cu, W, Co, Ru, and Al. Layer 102 can be an ultra-low-k dielectric material. Example materials of layer 102 can include oxides, tetraethyl orthosilicate (TEOS), low-k dielectric materials, and/or ultra-low-k dielectric materials. The dielectric constant (k) of low-k dielectric materials can be equal to or less than about 3.0, 3.7, and/or 3.9 in one or more embodiments of the invention. In one or more embodiments of the invention, layers 104 and 108 can include be selected from the same materials. Example materials of layers 104 and 108 can include SiN, SiC, SiCN(H), SiC(N) (where SiC(N) denotes SiC doped with N), and SiC(NH) (where SiC(NH) denotes SiC doped with N and H). Layer 106 is an interlayer dielectric or inter-level dielectric (ILD), and layer 106 can be an ultra-low-k dielectric material. Example materials of layer 106 can include SiN, SiOx, SiCN, and SiCN(H). Examples materials of spacer material 110 can include SiN, SiC, SiCN(H), etc.

For MRAM pillars 170 and 172, example materials of the bottom electrode 130 and the top electrode can include Nb, NbN, W, WN, Ta, TaN, Ti, TiN, Ru, Mo, Cr, V, Pd, Pt, Rh, Sc, Al, and/or other high melting point metals or conductive metal nitrides. Although individual layers of the MTJ 132 are not delineated in FIG. 1, the MTJ 132 includes an insulating tunnel barrier layer sandwiched by a free magnetic layer and a reference magnetic layer, where the free magnetic layer or reference magnetic layer can be on top. The tunnel barrier is non-magnetic, and example materials of the tunnel barrier layer can include MgO, $AlO_x$, etc. The free magnetic layer has a magnetic moment or magnetic direction that can be changed/flipped, while the reference magnetic layer has a magnetic moment that is fixed as a reference as understood by one skilled in the art. The free magnetic layer and reference magnetic layer are made of one or more ferromagnetic materials. Example ferromagnetic materials can include Co, Fe, and/or Ni, along with alloys of Co, Fe, and/or Ni. The ferromagnetic materials can be doped with non-magnetic doping elements as desired, such as Ta, Ti, Hf, Cr, Nb, Mo, and/or Zr.

Figure 2:
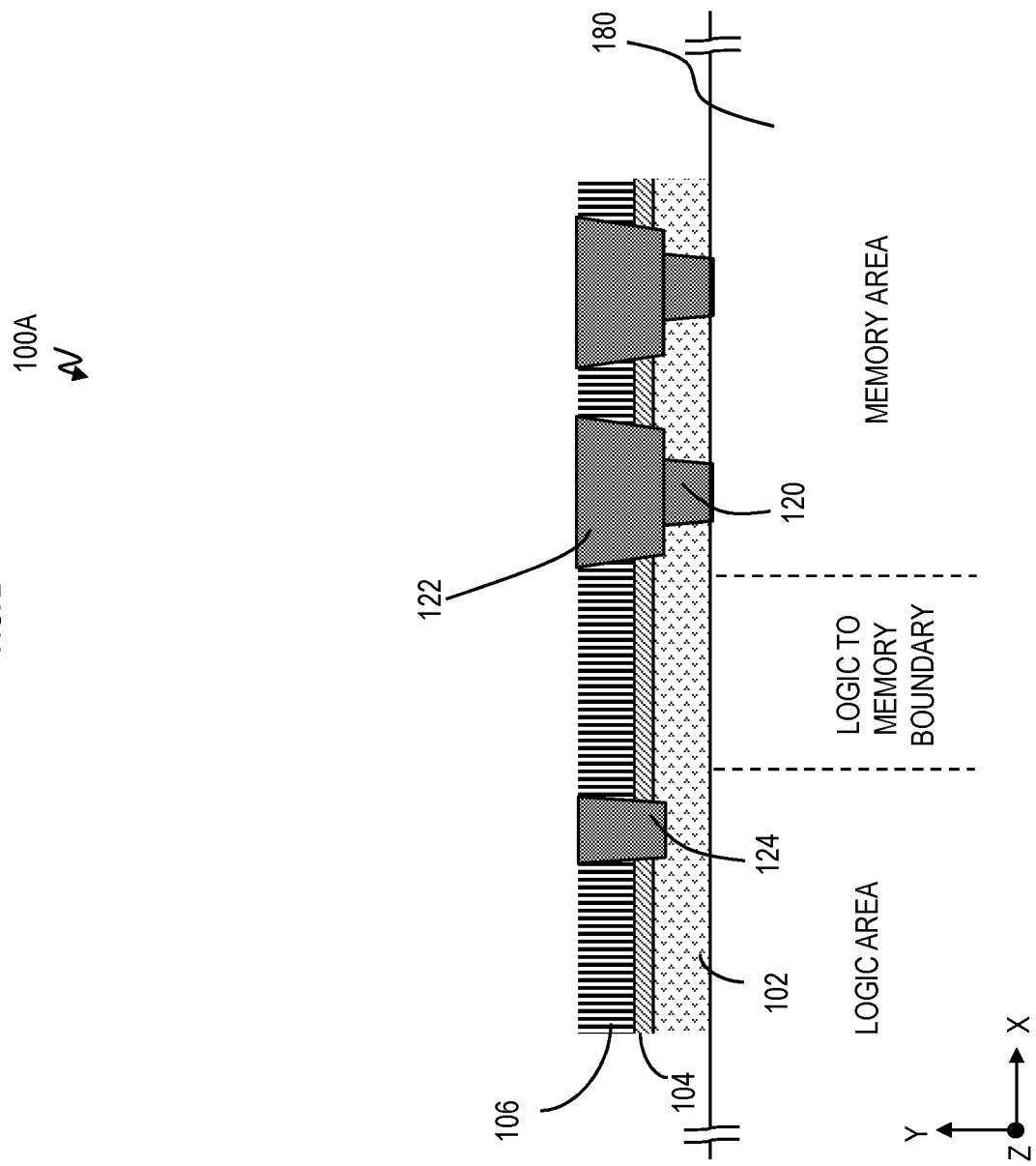

Turning to fabrication operations for forming the IC wafer 100 (shown in FIG. 1), FIGS. 2-12 illustrate cross-sectional views of a portion of an IC wafer 100A after fabrication operations according to embodiments of the invention. The last fabrication operations applied to the IC wafer 100A after the fabrication operations depicted in FIG. 12 result in the IC wafer 100. FIG. 2 depicts a cross-sectional view of the IC wafer 100A according to one or more embodiments of the invention. The IC wafer 100A at the fabrication stage shown in FIG. 2 can be formed using standard lithography processing. Layer 102 is formed on the substrate 180, and the substrate 180 can generally include one or more memory areas, one or more logic areas, and a logic to memory boundary. Interconnects 120 are formed in layer 102.

Openings (not shown) are etched into layer 102 and are filled with conductive material to form interconnects 120 as shown in FIG. 2. A wet etch or dry etch can be utilized to form the openings in layer 102 according to the pattern, and a reactive ion etch (ME) can be used to create the openings, for example. Layer 104 is deposited on layer 102, and layer 106 is deposited on layer 104. Layer 104 is a cap dielectric that acts as an electromigration barrier or protection layer for interconnects 120, while layer 102 is a conventional ILD layer. Similarly, openings are etched in layer 104 and 106 and filled with conductive material to form interconnects 122 and 124. There can be various techniques to form interconnects 120, 122, and 124 (and other interconnects), and examples are for explanation purposes. In one or more embodiments of the invention, the damascene process can be utilized to form these and other interconnects discussed herein. In some cases, interconnects 120 and 124 are viewed as the bottom metal layer or metal layer 1 (e.g., M1 layer).

Figure 3:
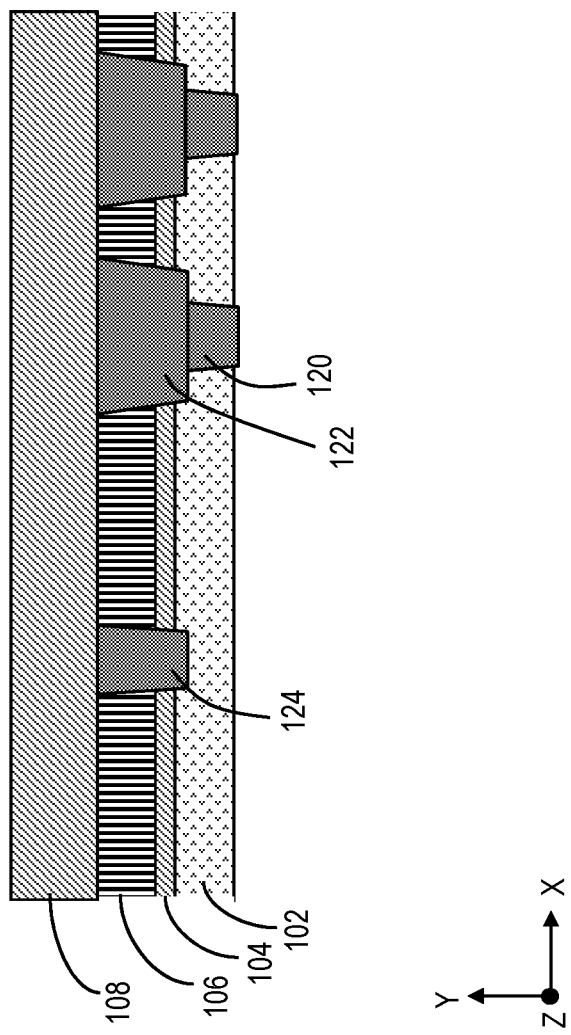
Figure 4:
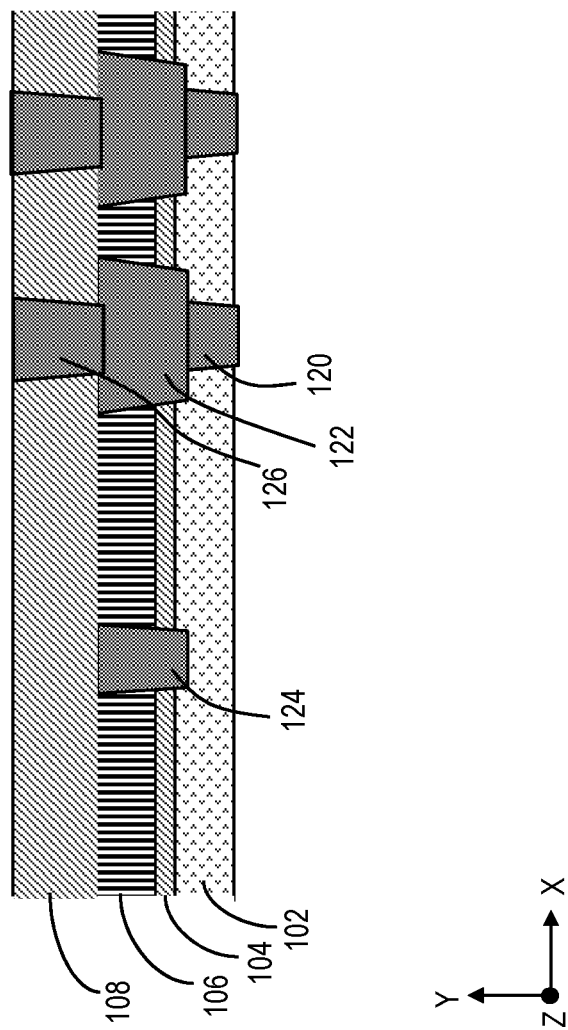

FIG. 3 depicts a cross-sectional view of the IC wafer 100A according to one or more embodiments of the invention. FIG. 3 illustrates cap dielectric deposition performed by depositing layer 108 as a cap on the top surface of IC wafer 100A. Bottom electrode contact formation is depicted in the cross-sectional view of FIG. 4. For example, as noted above, openings can be formed in layer 108 and filled with conductive material, thereby forming interconnects 126 on top of interconnects 122. Chemical mechanical polishing/planarization (CMP) can be performed. Interconnects 126 serve will serve as the bottom contacts for the MRAM pillars 170 and 172.

Figure 5:
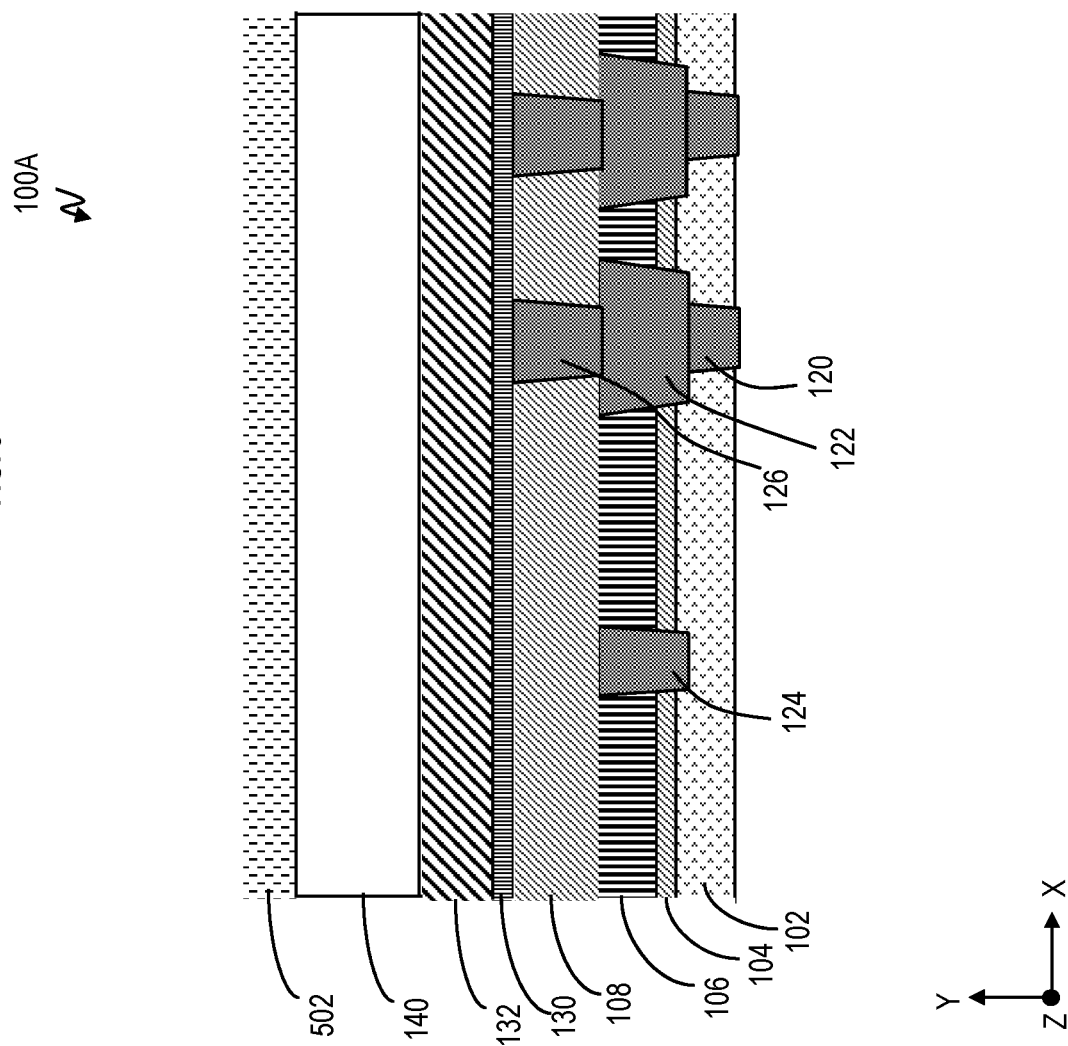

FIG. 5 depicts a cross-sectional view of the IC wafer 100A according to one or more embodiments of the invention. FIG. 5 illustrates layers for the MTJ stack and hardmask deposition. For example, the layer for bottom electrode layer 130 is formed to contact interconnects 126. The MTJ 132 is formed on top of the layer used to form bottom electrode 130. A layer forming the top electrode 140 is deposited on MTJ 132. The layer forming top electrode 140 also serves as a metal hardmask in subsequent fabrication operations. As seen in FIG. 5, layer 502 is deposited on the layer forming top electrode 140. Layer 502 serves as a dielectric hardmask in subsequent fabrication operations.

Figure 6:
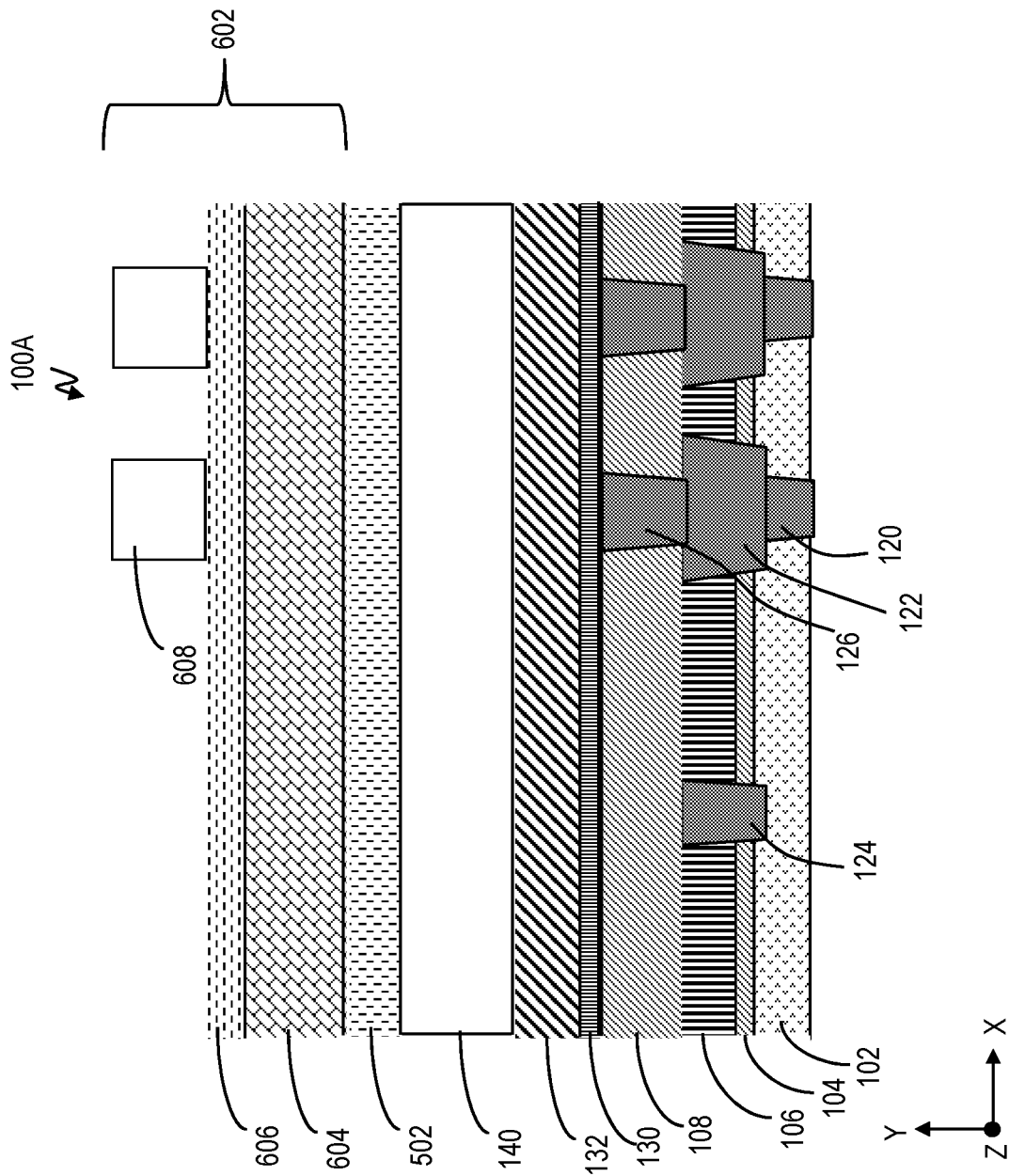

FIG. 6 depicts a cross-sectional view of the IC wafer 100A according to one or more embodiments of the invention. FIG. 6 illustrates MTJ pillar lithography patterning. For example, a block mask or lithography stack 602 is formed on layer 502, and lithography is performed to form a pattern in the block mask or lithography stack 602. As shown in FIG. 6, the lithography stack 602 can include a planarization layer 604 deposited on layer 502 (e.g., dielectric hardmask). The planarization layer 604 can be an organic planarization layer (OPL), organic dielectric layer (ODL), etc. An anti-reflective material 606 can be formed on top of the planarization layer 604. The anti-reflective material 606 can be a silicon-based material, including but not limited to silicon anti-reflective coating (SiARC), silicon oxide, silicon oxynitride, etc. The anti-reflective material can include tetraethyl orthosilicate (TEOS). Other example materials of the anti-reflective material 606 can include aluminum nitride, titanium oxide, etc. Photoresist material 608 is deposited on top of anti-reflective material 606 and patterned to pillars/blocks that correspond to future locations for MRAM pillars 170 and 172.

Figure 7:
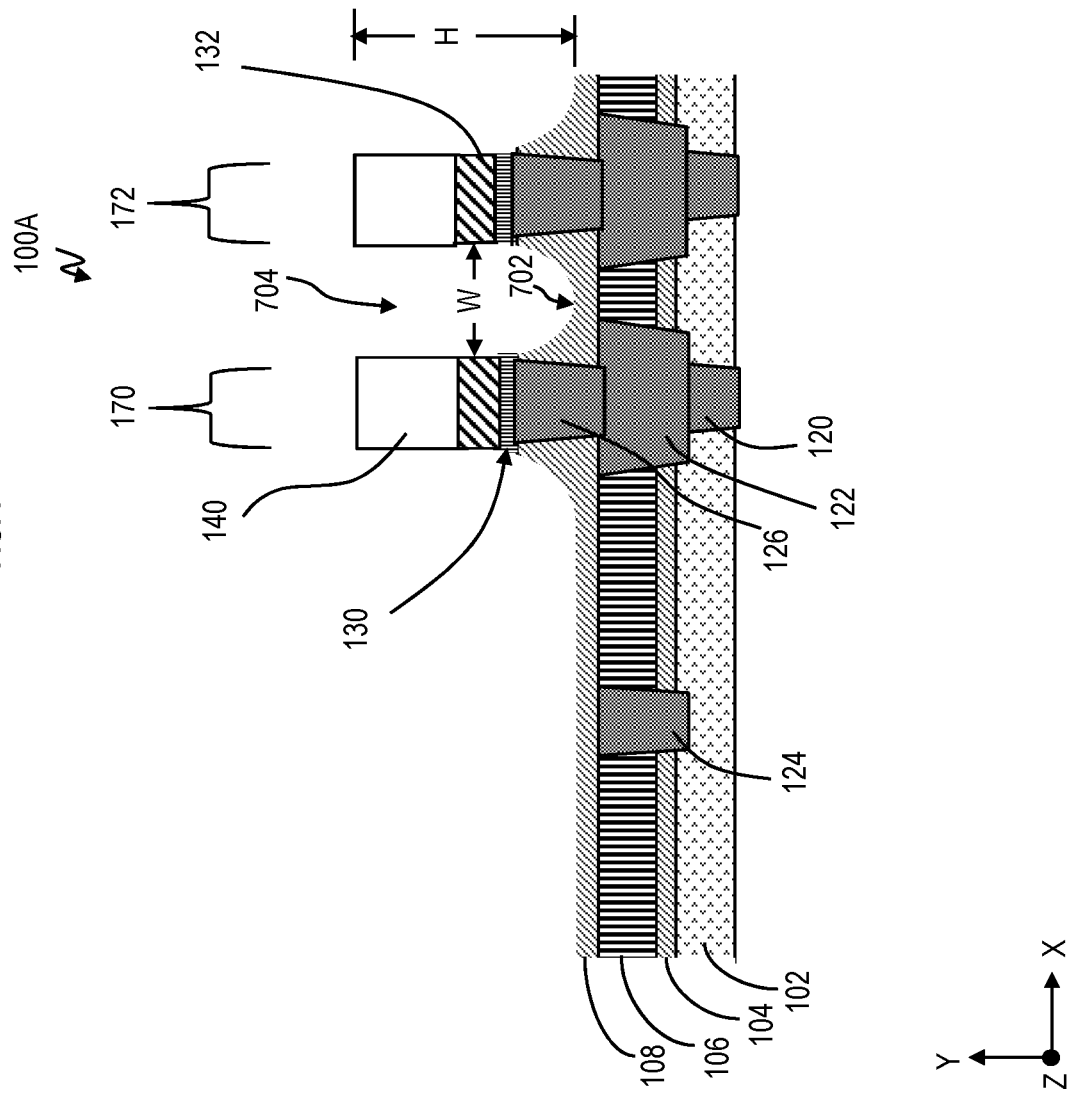

FIG. 7 depicts a cross-sectional view of the IC wafer 100A according to one or more embodiments of the invention. FIG. 7 illustrates pattern transfer to the MTJ stack, for example, using a RIE etch. Using the blocks of photoresist material 608 as a pattern, etching can be performed through anti-reflective material 606, planarization layer 604, and layer 502. The planarization layer 604 can be removed using a standard ash chemistry, which also removes layers above planarization layer 604. Using the previously patterned layer 502 (e.g., patterned hardmask layer), the pattern is further transferred (e.g., using a plasma etch or RIE etch) to form MRAM pillars 170 and 172 of top electrode 140, MTJ 132, and bottom electrode 130 depicted in FIG. 7. MRAM pillars 170 and 172 can be columns. When patterning MRAM pillars 170 and 172, portions of layer 108 are also etched into a curved shape because of, for example, the RIE etch and the tight pitch of the MRAM pillars. Although a cross-sectional view is depicted in FIG. 7, layer 108 is curved all around MRAM pillars 170 and 172 as the footings for MRAM pillars 170 and 172. The patterned layer 502 is subsequently removed.

As seen in FIG. 7, forming MRAM pillars 170 and 172 leaves trenches or openings 704. The bottom part of opening 704 is formed as a curved portion or dip 702 in layer 108. The MRAM pillars 170 and 172 can have a pillar pitch of about 80 nm to 1000 nm, which is measured from the center of one MRAM pillar to the center of the next MRAM pillar. The width (W) of opening 704 in the X-axis can range from about 100 nm to 1000 nm, and the height (H) of opening 704 can range from about 100 nm to 1000 nm in the Y-axis. Although the tight spacing in the width (W) compared to the larger spacing in the height (H) can result in a void or gap in subsequent fill material for opening 704, one or more embodiments of the invention are configured to prevent or avoid such voids or gaps in fill material. Although FIG. 7 depicts two MRAM pillars 170 and 172, it should be appreciated that embodiments of the invention are not meant to be limited to two MRAM pillars. It should be appreciated that there are numerous MRAM pillars adjacent to one another having openings 704 in between.

Figure 8:
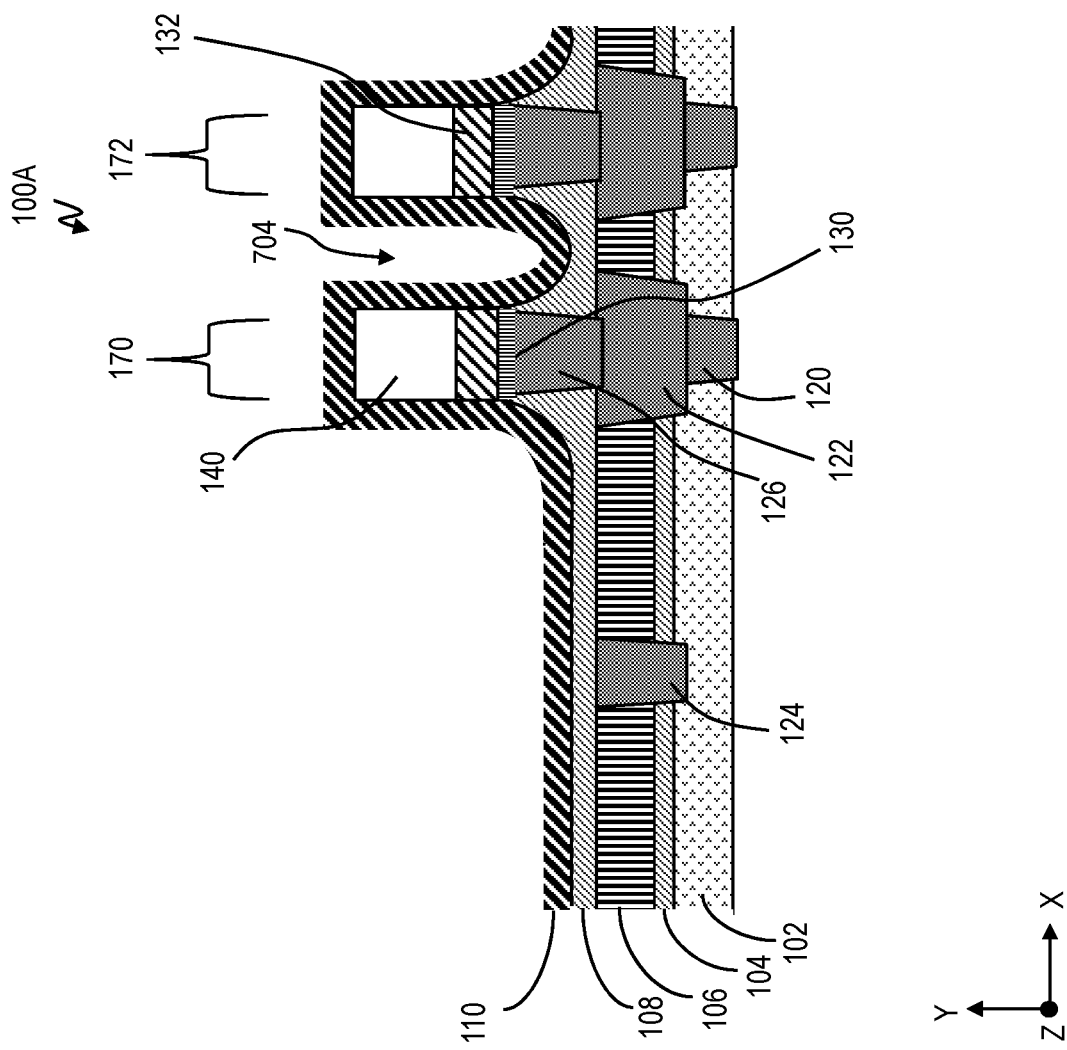
Figure 9:
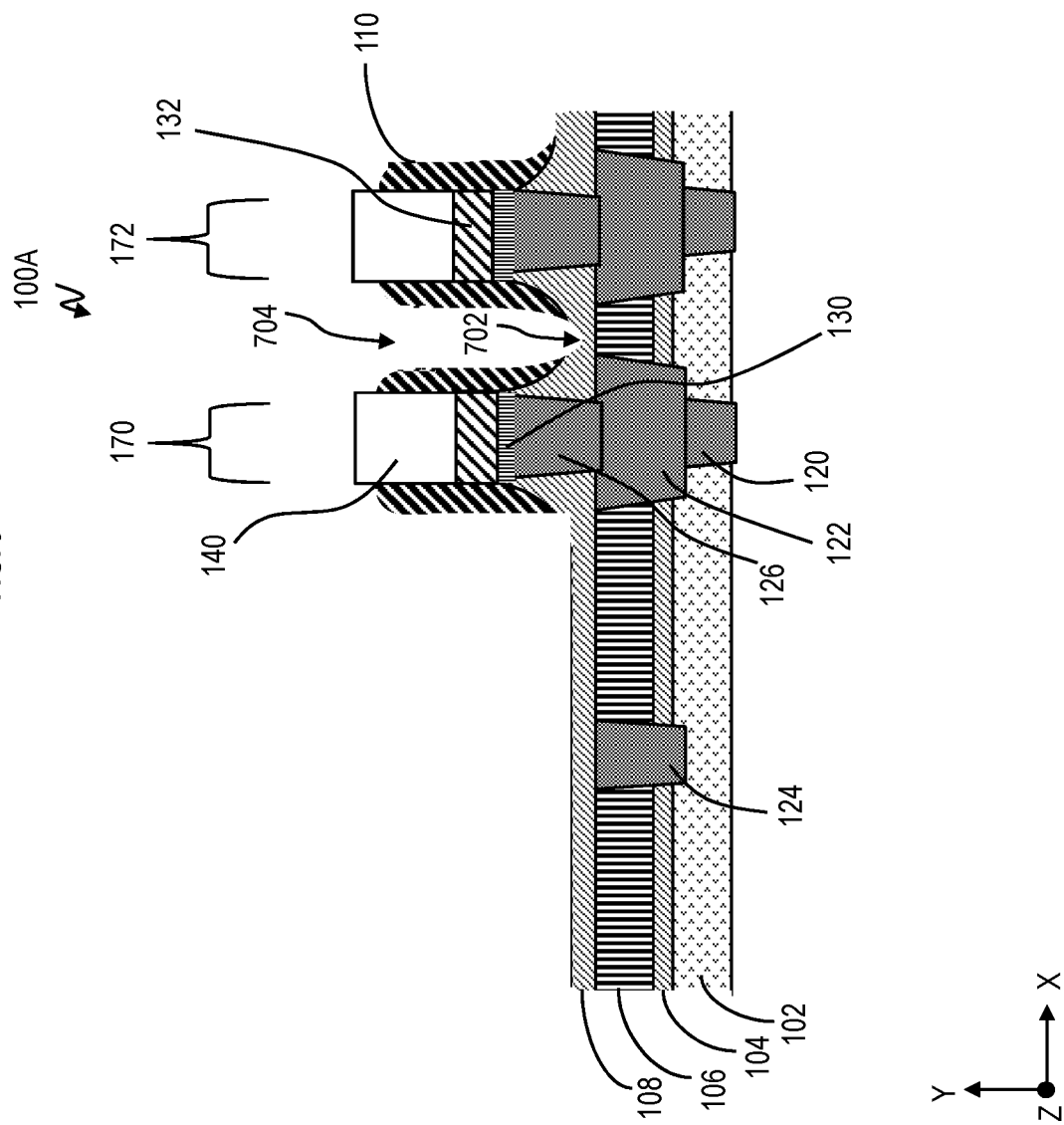

FIG. 8 depicts a cross-sectional view of the IC wafer 100A according to one or more embodiments of the invention. FIG. 8 illustrates encapsulation deposition. Spacer material 110 is formed as an encapsulation layer on top of IC wafer 100A. Encapsulation etch back is depicted in FIG. 9. As can be seen, spacer material 110 is etched back to cover sides of bottom electrode 130, sides of MTJ 132, and part of top electrode 140. The previous deposition of spacer material 110 covered the curve or dip 702, and etch back again exposes the bottom curve or dip 702 of opening 704 in layer 108. The bottom curve or dip 702 will serve as the foundation for bilayer dielectric 190. The encapsulation etch back is an anisotropic etch (e.g., a wet etch) which causes a squared off appearance to the left of MRAM pillar 170. However, the bottom curve or dip 702 of opening 704 remains because of the tight pitch between MRAM pillars 170 and 172. Although no further MRAM pillar is illustrated to the right of MRAM pillar 172, it is contemplated that further MRAM pillars are to the right of MRAM pillar 172 thereby allowing a curvature on the right side of MRAM pillar 172. Spacer material 110 serves as encapsulation material that protects MTJ 132 from subsequent processing including ambient air and reactants used during subsequent fabrication operations. Spacer material 110 also fills in a portion of the curve or dip 702.

Figure 10:
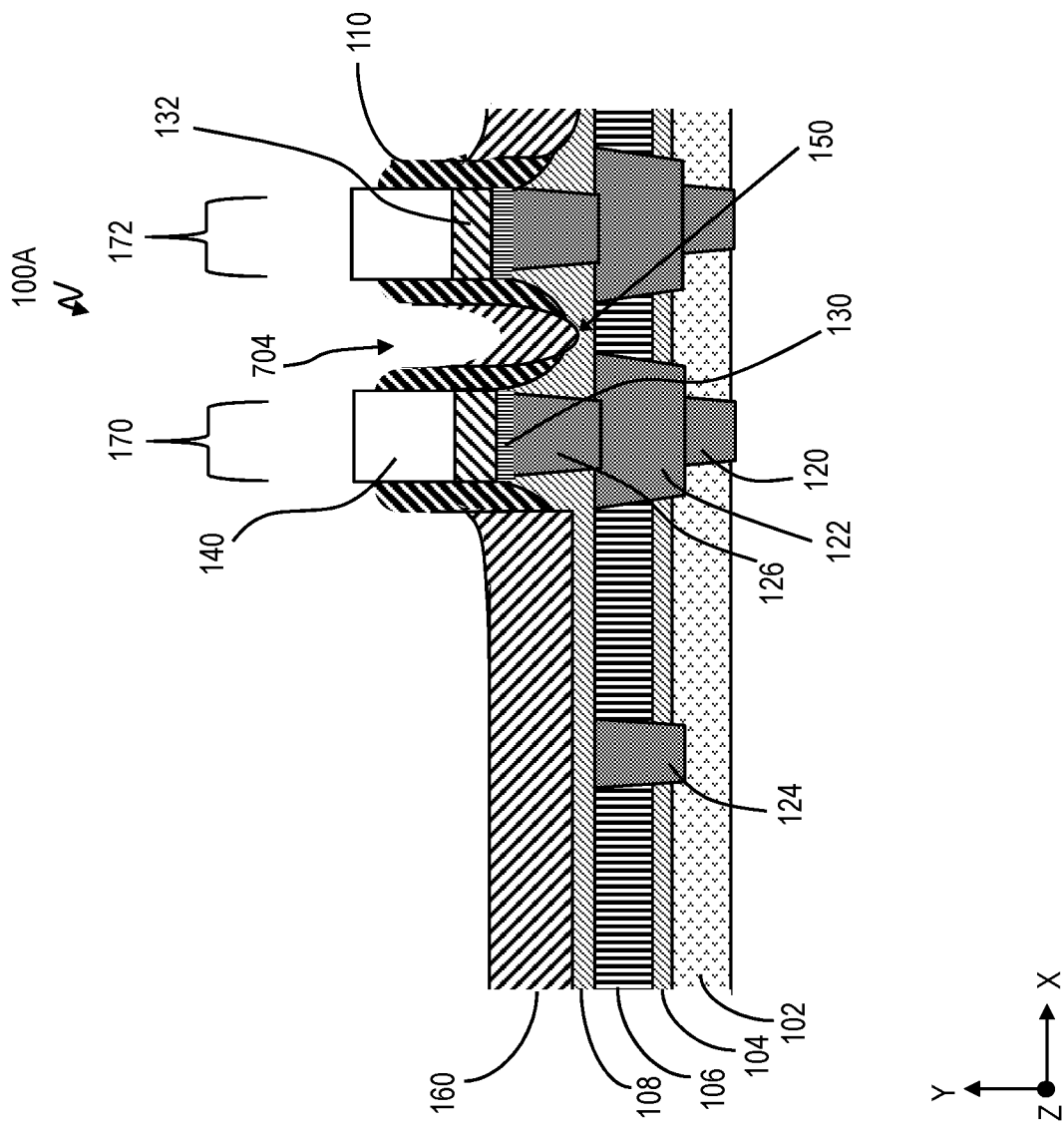

FIG. 10 depicts a cross-sectional view of the IC wafer 100A according to one or more embodiments of the invention. FIG. 10 illustrates a bottom-up dielectric fill. The first or lower dielectric material 160 is formed to partially fill opening 704 and has a dip or bottom curved portion 150 which conforms to bottom curve or dip 702 of layer 108. The upper surface of first or lower dielectric material 160 correspondingly has a curvature with a dip in the center, serving as the foundation for the subsequent dielectric layer. No etch of first or lower dielectric material 160 is performed prior to forming second or upper dielectric material 162; by not requiring the etch this avoids damage to the first or lower dielectric material 160, thereby allowing first or lower dielectric material 160 to have good integrity and no damage in preparation for deposition of second or lower dielectric material 162. Spacer material 110 supports the bottom curved portion 150 of first or lower dielectric material 160 between MRAM pillars 170 and 172 while there are other portions of first or lower dielectric material 160 which do not conform to the curved portion or dip 702 (shown in FIG. 9).

As seen in FIG. 10, the first or lower dielectric material 160 is formed on layer 108 and spacer material 110. The first or lower dielectric material 160 can be a flowable dielectric material having a good gap fill property and/or a dielectric material that can be deposited on dielectric material selective to metal using selective atomic layer deposition (ALD). When deposited as a flowable dielectric material, this process includes spin coating or flowable chemical vapor deposition (FCVD). When deposited using selective ALD, this process means that the first or lower dielectric material 160 grows (only) on dielectric material of layer 108 and spacer material 110 but not on metal such as top electrode 140.

Figure 11:
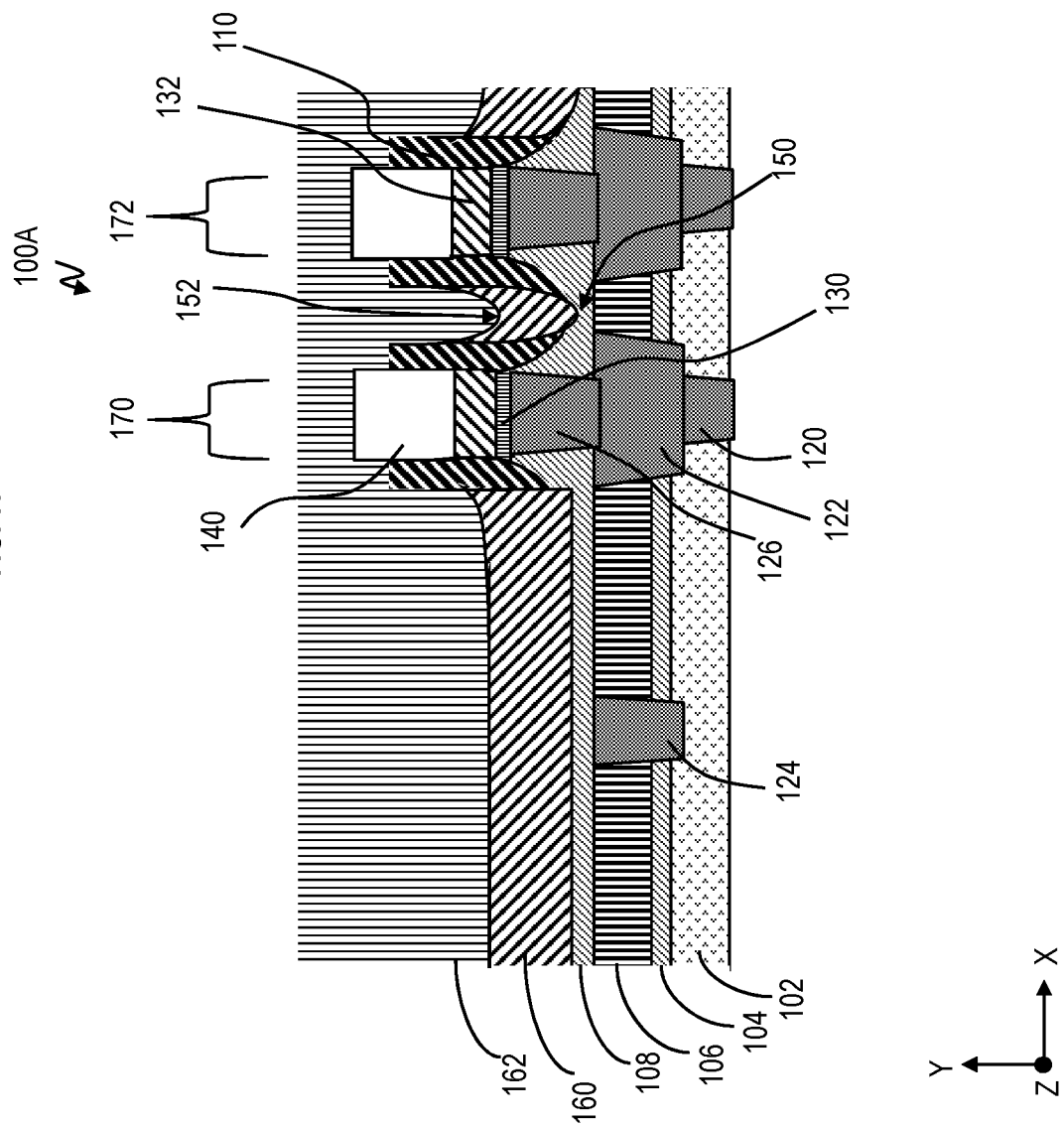

FIG. 11 depicts a cross-sectional view of the IC wafer 100A according to one or more embodiments of the invention. FIG. 11 illustrates a bottom-up dielectric fill. The second or upper dielectric material 162 is deposited on top of the first or lower dielectric material 160, and CMP is performed. The second or upper dielectric material 162 is formed using a conformal deposition, such as, for example physical vapor deposition (PVD), chemical vapor deposition (CVD), atomic layer deposition (ALD), etc. As seen in FIG. 11, the second or upper dielectric material 162 is formed to continue filling opening 704 and has a dip or bottom curved portion 152 which correspondingly or symmetrically conforms to the curve or dip in the upper surface of first or lower dielectric material 160. First or lower dielectric material 160 can be formed with a thickness ranging from about 15-500 nm in the Y-axis, depending on the spacing between MRAM pillars and height 170 (e.g., width W and height H in FIG. 7) such that the narrower the spacing the thicker the first or lower dielectric material 160. As such, this reduces the aspect ratio for deposition of second or upper dielectric material 162. Also, as seen in FIG. 11, both the first or lower dielectric material 160 and second or upper dielectric material 162 are formed on sidewalls of spacer material 110 but are not in direct contact with MTJ 132.

Figure 12:
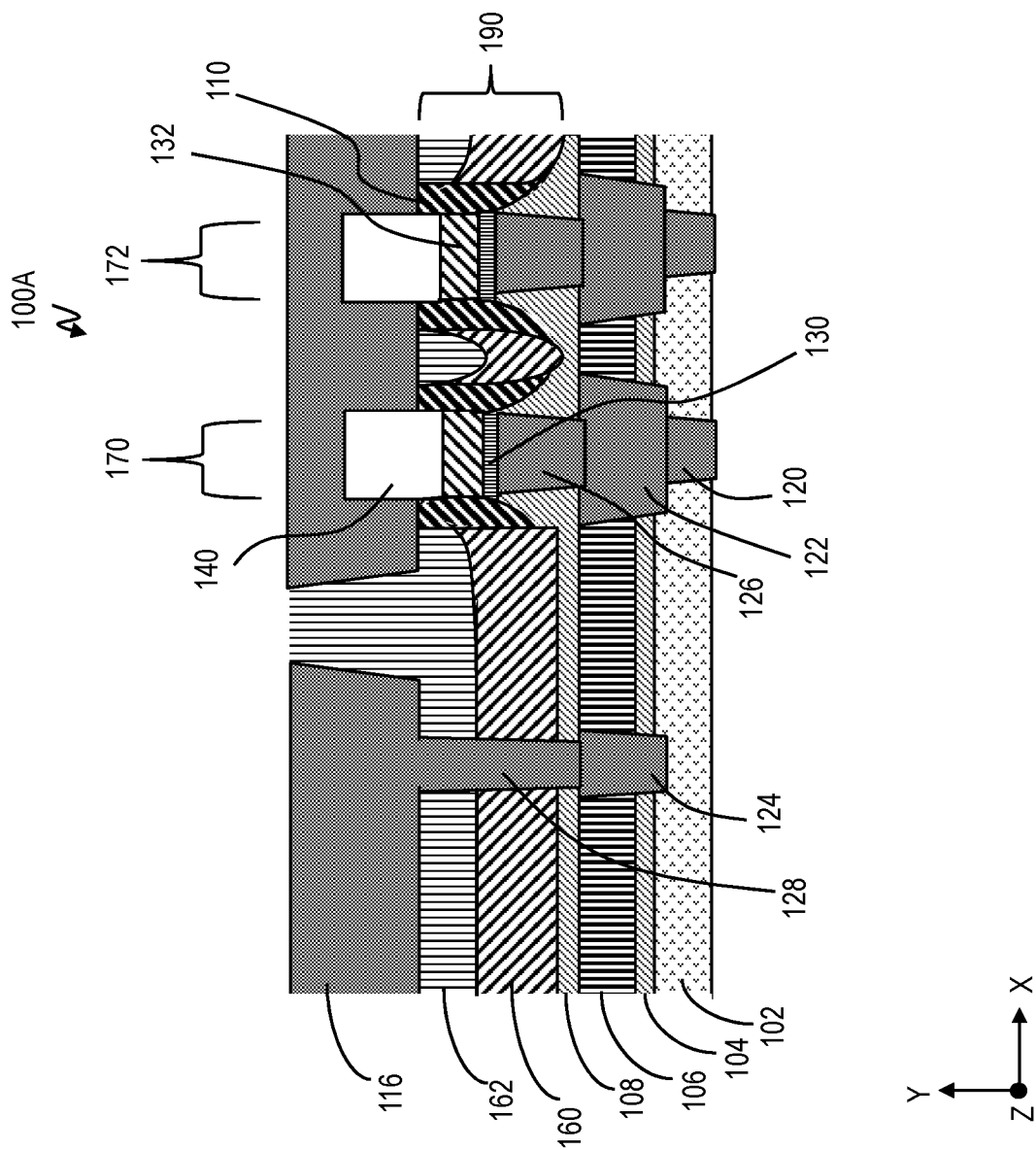

FIG. 12 depicts a cross-sectional view of the IC wafer 100A according to one or more embodiments of the invention. FIG. 12 illustrates top electrode contact formation. As noted herein, openings (not shown) can be formed in the second or upper dielectric material 162, such that top electrodes 140 are exposed. Conductive material is deposited in the openings resulting in metal layer 116. As can be seen on the right side of FIG. 12, top electrodes 140 of MRAM pillars 170 and 172 are in contact with the metal layer 116.

As discussed herein, the bilayer dielectric 190 is formed with two different fill processes in order to improve the quality of dielectric fill between and/or surrounding MRAM pillars 170 and 172. This technique avoids creation of voids and/or seams (i.e., empty spaces) in bilayer dielectric 190.

Additionally, by having first or lower dielectric material 160 formed with dip or bottom curved portion 150 (depicted in FIG. 10) and having second or upper dielectric material 162 correspondingly formed with dip or bottom curved portion 152 (depicted in FIG. 11), these bottom curved portions 150 and 152 contribute to bilayer dielectric 190 being formed without voids and/or seams between MRAM pillars 170 and 172.

FIG. 13 is a flow chart of a method 1300 of forming an integrated circuit (IC) 100 according to one or more embodiments. The method 1300 includes forming magnetoresistive random access memory (MRAM) pillars 170 and 172 at block 1302. The MRAM pillars are memory elements. At block 1304, the method 1300 includes forming a bilayer dielectric 190 between the MRAM pillars 170 and 172, the bilayer dielectric 190 having an upper dielectric material 162 formed on a lower dielectric material 160 without requiring an etch of the lower dielectric material 160 prior to forming the upper dielectric material 162, thereby preventing a void (or empty space) in the bilayer dielectric 190, the lower dielectric material 160 having one or more flowable dielectric materials.

Further, the upper dielectric material and the lower dielectric material are formed by different deposition processes. The upper dielectric material is formed by a conformal deposition process. The upper dielectric material has a higher dielectric breakdown voltage than the lower dielectric material. The lower dielectric material includes one or more flowable dielectric materials. The lower dielectric material is formed by flowing one or more lower dielectric materials between the MRAM pillars 170 and 172 and curing (or annealing) the one or more lower dielectric materials. The lower dielectric material is deposited using selective atomic layer deposition (ALD) such that the lower dielectric material is deposited on an underlying dielectric layer (e.g., layer 108 and/or spacer material 110) selective to metal (e.g., top electrode 140). The lower dielectric material is deposited using a bottom-up deposition process. No etching of the lower dielectric material is performed prior to depositing the upper dielectric material on the lower dielectric material, thereby avoiding damage (and/or potential damage) to the lower dielectric material and additional fabrication operations.

FIG. 14 is a flow chart of a method 1400 of forming an integrated circuit (IC) 100 according to one or more embodiments. The method 1400 includes forming MRAM pillars 170 and 172, the MRAM pillars being above a layer 108 at block 1402. The MRAM pillars are memory elements. At block 1404, the method 1400 includes forming a spacer material 110 on the layer 108 and the MRAM pillars 170 and 172. At block 1406, the method 1400 includes etching back the spacer material 110 to expose part of the layer 108 between the MRAM pillars 170 and 172, while portions of the spacer material 110 remain to (partially) encapsulate the MRAM pillars 170 and 172. At block 1408, the method 1400 includes forming a lower dielectric material 160 of a bilayer dielectric 190 on the exposed part (which includes the curved portion or dip 702) of the layer 108 between the MRAM pillars 170 and 172. At block 1410, the method 1400 includes forming an upper dielectric material 162 of the bilayer dielectric 190 on the lower dielectric material 160, the bilayer dielectric 190 being free of a void (e.g., empty space) between the MRAM pillars 170 and 172.

The upper dielectric material is formed on the lower dielectric material without requiring an etch of the lower dielectric material prior to forming the upper dielectric material, thereby preventing a void in the bilayer dielectric. For example, no etching is required of the lower dielectric material 160 formed in FIG. 10 prior to forming the upper dielectric material 162 formed in FIG. 11.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a portion of an integrated circuit (IC), the method comprising:
    forming pillars of a set of memory elements; and
    forming a bilayer dielectric between the pillars, the bilayer dielectric being formed on spacer material and an underlying dielectric layer between the pillars, the bilayer dielectric comprising an upper dielectric material formed on a lower dielectric material without requiring an etch of the lower dielectric material prior to forming the upper dielectric material, thereby preventing a void in the bilayer dielectric, the lower dielectric material comprising one or more flowable dielectric materials and being in contact with an exposed portion of the underlying dielectric layer through the spacer material.

2. The method of claim 1, wherein the upper dielectric material and the lower dielectric material are formed by different deposition processes.

3. The method of claim 1, wherein the upper dielectric material is formed by a conformal deposition process.

4. The method of claim 1, wherein the upper dielectric material comprises a higher dielectric breakdown than the lower dielectric material.

5. The method of claim 1, wherein the upper and lower dielectric materials both comprise a curved bottom located between the pillars.

6. The method of claim 1, wherein forming the lower dielectric material comprises flowing the one or more flowable dielectric materials between the pillars and curing the one or more flowable dielectric materials.

7. A method of forming a portion of an integrated circuit (IC), the method comprising:
    forming pillars of a set of memory elements; and
    forming a bilayer dielectric between the pillars, the bilayer dielectric comprising an upper dielectric material formed on a lower dielectric material without requiring an etch of the lower dielectric material prior to forming the upper dielectric material, thereby preventing a void in the bilayer dielectric, the lower dielectric material comprising one or more flowable dielectric materials, wherein the lower dielectric material is deposited using selective atomic layer deposition such that the lower dielectric material is deposited on an underlying dielectric layer selective to metal.

8. The method of claim 1, wherein the lower dielectric material is deposited using a bottom-up deposition process.

9. The method of claim 1, wherein no etching of the lower dielectric material is performed prior to depositing the upper dielectric material on the lower dielectric material, thereby avoiding damage to the lower dielectric material.

10. A method of forming a portion of an integrated circuit (IC), the method comprising:
    forming pillars of a set of memory elements, the pillars being above a layer;
    forming a spacer material on the layer and the pillars;
    etching through a portion of the spacer material to expose part of the layer between the pillars while portions of the spacer material remain to encapsulate the pillars;
    forming a lower dielectric material of a bilayer dielectric on the part of the layer exposed between the pillars; and
    forming an upper dielectric material of the bilayer dielectric on the lower dielectric material, the bilayer dielectric being free of a void between the pillars.

11. The method of claim 10, wherein the upper dielectric material and the lower dielectric material are formed by different deposition processes, the upper and lower dielectric materials both comprising a curved bottom located between the pillars.

12. The method of claim 10, wherein the upper dielectric material is formed by a conformal deposition process.

13. The method of claim 10, wherein the upper dielectric material comprises a higher dielectric breakdown than the lower dielectric material.

14. The method of claim 10, wherein the lower dielectric material comprises one or more flowable dielectric materials.

15. The method of claim 10, wherein forming the lower dielectric material comprises flowing one or more flowable dielectric materials between the pillars and curing the one or more flowable dielectric materials.

16. The method of claim 10, wherein the lower dielectric material is deposited using selective atomic layer deposition such that the lower dielectric material is deposited on the layer selective to metal.

17. The method of claim 10, wherein the upper dielectric material is formed on the lower dielectric material without requiring an etch of the lower dielectric material prior to forming the upper dielectric material, thereby further preventing the void in the bilayer dielectric.

* * * * *